United States Patent [19]

Seifert et al.

[11] Patent Number: 4,475,358

[45] Date of Patent: Oct. 9, 1984

[54] AIR CONDITIONER

[75] Inventors: Rolf Seifert, Ennepetal; Volker Schlicker, Radevormwald, both of Fed. Rep. of Germany

[73] Assignee: Firma Ing. Rolf Seifert Electronic, Fed. Rep. of Germany

[21] Appl. No.: 414,852

[22] Filed: Sep. 3, 1982

[30] Foreign Application Priority Data

Sep. 12, 1981 [DE] Fed. Rep. of Germany ....... 3136226

[51] Int. Cl.³ .............................................. F25D 17/04
[52] U.S. Cl. ........................................ 62/186; 62/419
[58] Field of Search ................ 62/419, 181, 183, 186, 62/506, 507, 508, 407, 428, 259.2

[56] References Cited

U.S. PATENT DOCUMENTS

| | | | |
|---|---|---|---|
| 2,158,403 | 5/1939 | Chamberlain | 62/506 X |
| 2,175,946 | 10/1939 | Smith | 62/506 X |
| 2,279,787 | 4/1942 | Huggins | 62/419 X |
| 2,318,893 | 5/1943 | Smith | 62/183 X |
| 2,438,114 | 3/1948 | Dennedy | 62/508 X |
| 2,478,617 | 8/1949 | Anderegg | 62/419 X |
| 2,538,382 | 1/1951 | Reilly | 62/419 X |
| 2,546,363 | 3/1951 | Jaeger | 62/419 X |
| 3,826,105 | 7/1974 | Marsteller | 62/186 X |

Primary Examiner—Lloyd L. King
Attorney, Agent, or Firm—Hill, Van Santen, Steadman & Simpson

[57] ABSTRACT

The invention relates to an air conditioner for cooling electrical parts which are situated in a cabinet. A coolant circulation consisting of evaporator, condenser and compressor is provided. The air heated by the electrical parts is blown past the evaporator inside a housing and is returned into the cabinet to be cooled. A condenser is provided for heat dissipation. The housing of the air conditioner is subdivided into a first area and into a second area by a wall, whereby the wall seals the respective air streams from one another. All components sensitive to dirt, dust, etc. are accommodated in the first area, whereas the condenser and an aerator are situated in the second area.

10 Claims, 5 Drawing Figures

AIR CONDITIONER

BACKGROUND OF THE INVENTION

The invention relates to an air conditioner for cooling electrical parts. More and more significance attaches to the problem of cooling such components, particularly electric components, given their technical development, since one strives to accommodate as many such components as possible, particularly electronic "intelligence", on the smallest space possible. Therefore, particularly when a plurality of individual devices have been combined in one housing, an attempt has been made to remove the arising heat with the assistance of aeration aggregates. Thereby, the disadvantage of jeopardizing the electrical components, particularly of electronics, due to the dirt drawn in by the aeration air derives. The resolution attempted in contrast thereto by means of cabinets and housings executed dust-tight fails in that, thus, even the slightest air exchange between the inside and outside is interrputed, so that even slight leakage power per unit to be cooled generates an inadmissible inside temperature in the housing. Further, heat exchanger systems have been provided in which the air heated by the electronics or the like within the housing surrounding the electronics is blown by ventilators past an extremely large air exchange surface which emits the heat to a liquid circulation. The warm liquid is conveyed toward the outside to a correspondingly large exchange surface outside of the housing or, respectively, cabinet and is emitted there to the ambient air with the assistance of ventilators. Here, one can only work with a positive temperature drop relative to the outside air. That means that the inside temperature in the cabinet with the electronics or the like must always be higher than the ambient temperature. When, then, the ambient temperature rises above a certain value, then such a heat exchange can no longer be employed. Finally, air conditioners according to the preamble of claim 1 are known. They all share the serious disadvantage that they provide coolers consisting of fine-meshed gilled or ribbed tubes. They are, therefore, unsuited for cooling with dirty air, since this would very rapidly result in the disintegrating of the gilled or ribbed tubes. In order to avoid this disadvantage, filter meshes have been introduced. However, experience has shown that these filter meshes are not changed by the user or are changed too late. This results in disruptions both of the air conditioner as well as of the system which it is meant to cool. A further disadvantage consisted therein that air laced with dirt also flowed around the compressor with all auxiliary and control elements, these then becoming correspondingly dirty or respectively, covered with dust. A further disadvantage of the known air conditioners lies therein that the diversion of the water condensation forming in the space to be cooled ensued toward the outside through a normal plastic hose and, thus, the problem arose for the user as to how he should eliminate this waste water. Finally, it should be pointed out that, given employment of standard components of air-conditioning, a device shape thereby derives which is not necessarily user-compatible, namely, a cubic device shape. A structural shape which is as flat as possible is, however, desirable for attachment to switch cabinets.

In contrast thereto, the object of the invention principally lies therein of designing an air conditioner according to the preamble of claim 1 to such effect that no danger of contamination of parts sensitive to dirt arises.

Due to the separation of the device into two areas protected against air passage, all components, including the compressor, sensitive to dirt and dust are accommodated in the dirt-free first area. The components, particularly the condenser, situated in the second area and, thus, in the stream of dirty air, can be designed without further ado in such manner that they are insensitive to dirt and such that no parts filtering off the dirt, such as ribs, tubes or filter meshes, are required. Thus, an inventive device can also be employed given extremely dirty ambient air. Further, it is functional both given low as well as, specifically, given high ambient temperatures, since the temperatures in the inside of the cabinet exhibiting the electrical components to be cooled is lower than, or, respectively, the same as the ambient temperature. At first, it seems nonsensical per se to also provide the heat-generating compressor in the air stream which is situated in the first area, and, thus, must be cold for cooling the electrical components and the like. Among other things, however, the resolution of the inventive object is achieved by means of disposing the compressor in said first area, accepting a heating of its air stream.

One of the features effects a metered feed of dust-free air to the compressor.

One of the features includes a design of the heat exchange surface of the condenser which is particularly dust-insensitive and easy to clean.

A structurally simple arrangement consisting of tube coils and heat exchange surfaces which produces good thermal contact is achieved by another feature;

Further features prevent water condensation which can have a destructive effect, particularly on sensitive electronic components, from suddenly occurring due to too low a temperature given by unintentional opening of the cabinet containing the electrical components.

Another feature includes the second area coming into consideration for contamination being exploited in order to distribute the water condensation ("liquid dirt") forming in the first area, whereby it is evaporated and, thus, eliminated.

An inventive air conditioner, thus, also resolves the water condensation problem. By means of a control-oriented protection, it prevents the electronics or the like built into the cabinet from being fogged with moisture. Further advantageous are a relatively low weight, as attractive as possible a design, and a selling price suited to the marketplace.

Finally, it should be mentioned that an inventive device is suitable both as original equipment as well as for re-equipping switch cabinets. It can be designed as a plug-in unit. The components provided in the inventive air conditioner are essentially maintenance-free and long-lived.

Further advantages and features of the invention can be derived from the further subclaims, as well as from the following description and the appertaining drawing of an inventive sample embodiment. Shown in the drawing are:

DESCRIPTION OF THE PREFERRED EMBODIMENTS

Figure 1:
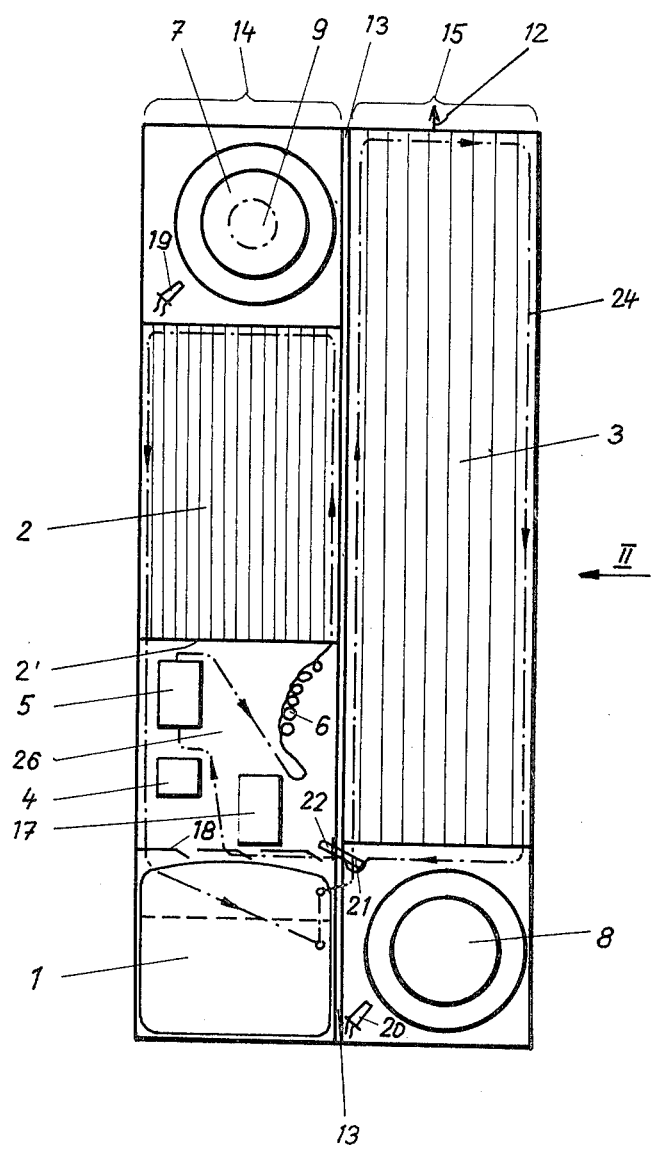
FIG. 1 is a sample embodiment of the invention both schematically and in a longitudinal section along the line I-I in FIG. 2.
Figure 2:
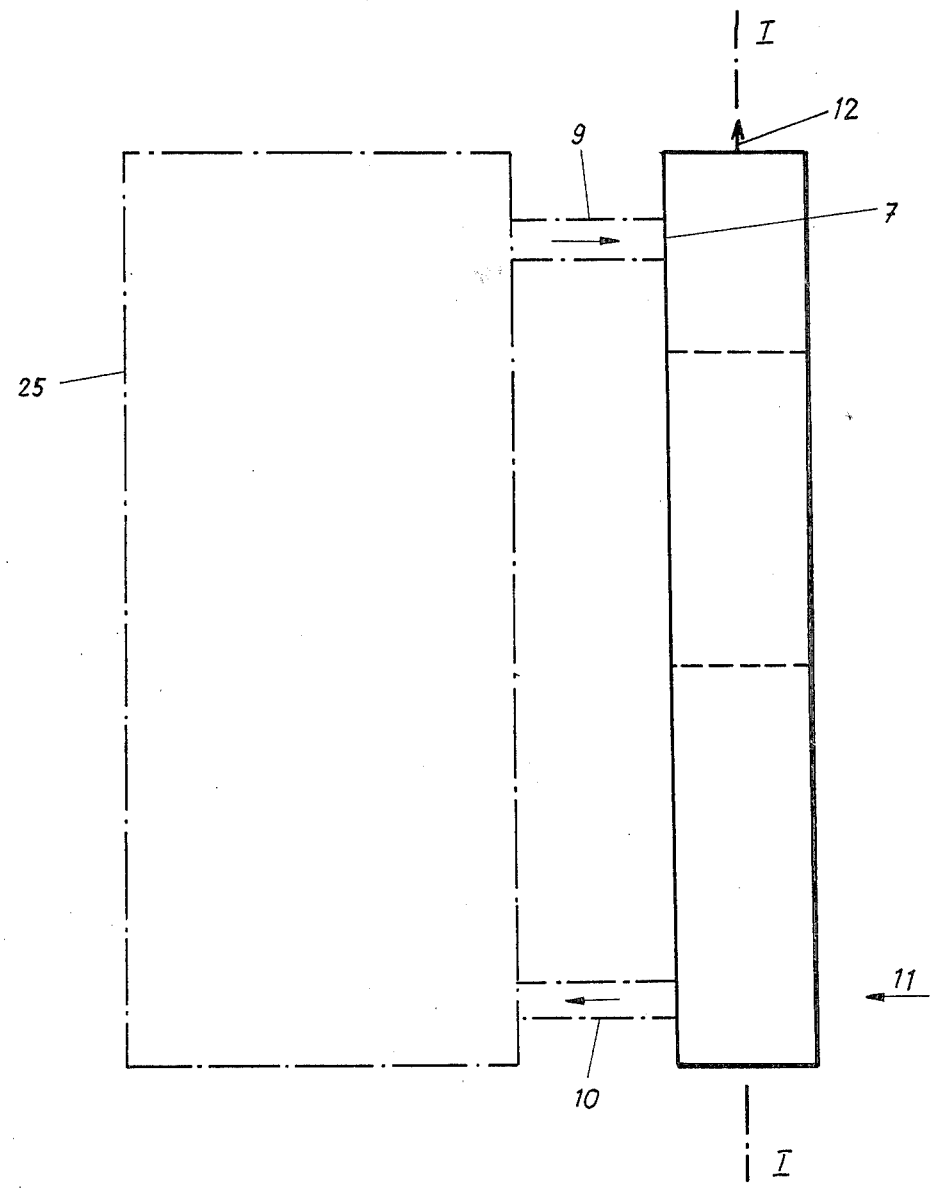
FIG. 2 is a view according to the arrow II in FIG. 1.

The housing of the air conditioner consists of the first area 14 and the second area 15 which are sealed by a partition 13 against passage of the air streams yet to be described below. Thereby, the illustration has been intentionally selected in a purely schematic manner. In FIG. 2, a cabinet or the like 25 is also indicated with dot-dash lines, the electrical components, particularly electronic components, to be cooled being situated therein. The air heated in the cabinet 25 is supplied through a feeder 9 likewise only indicated with dot-dash lines to the ventilator 7 of the first area and is then returned cooled into the cabinet 25 from the lower (in FIGS. 1 and 2) section of the first area and over a line 10 indicated with dot-dash lines. Within the first area 14, the warm cabinet air to be cooled is conducted by the ventilator 7 through or along the evaporator 2, whereby the cooling agent is warmed therein. The cool air at the ouput 2' of the evaporator 2 flows through a space 26 in which dirt-sensitive parts or aggregates such as a pressure regulator 4, a dryer 5, a capillary throttle 6 and control electronics 17 are situated. A part of this air stream not coming into contact with the environment and, thus, being dust-free is diverted by deflection means 18 over the compressor 1 and likewise cools this. The common return of both air substreams into the cabinet 25 ensues over the aforementioned line 10.

All elements which cannot be negatively influenced due to dust, humidity and other air contaminations are situated in the second area 15. First, this is the condenser 3. The cooling agent heated in the evaporator 2 is again placed under high pressure by the compressor 1, and after transfer into the second area 15, is reliquified in the condenser 3. To this end, the ambient air of the cabinet is supplied to the compressor in the second area 15 over an air intake 11 and an aerator or, respectively, ventilator 8 for the purpose of cooling, said air then emerging heated at 12. This ventilator 8 is dirt-insensitive. This is also true of the cooling surfaces of the condenser 3 to be explained in yet greater detail below.

The liquified, cooled cooling agent flows back into the evaporator 2 over the dryer 5 in the first area 14 and the flash capillary 6. In case of disruption, the said pressure regulator 4 switches the compressor 1 off. Over temperature sensors 19 and 20, the electronics 17 controls both the ventilator speed of the aerator or, respectively, ventilator 7, as well as the on-time of the compressor 1. By so doing, insofar as required or, respectively, desired, the temperature in the cabinet 25 can be adapted by controlling the air speed in the first area 14 so that it does not become lower than the outside temperature.

Figure 3:
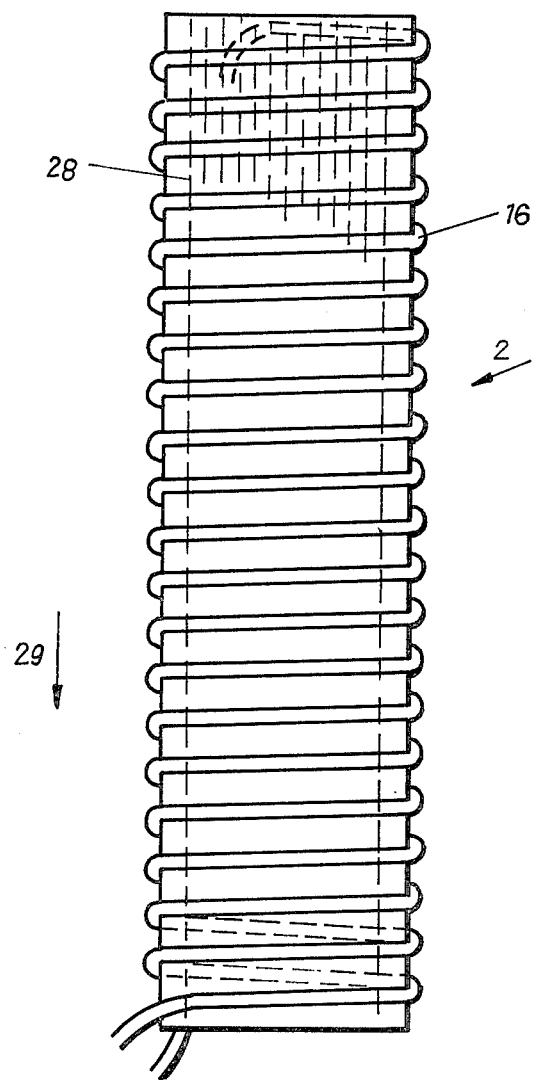
FIG. 3 is a side view of the condenser in an enlarged scale in comparison to FIGS. 1 and 2.
Figure 4:
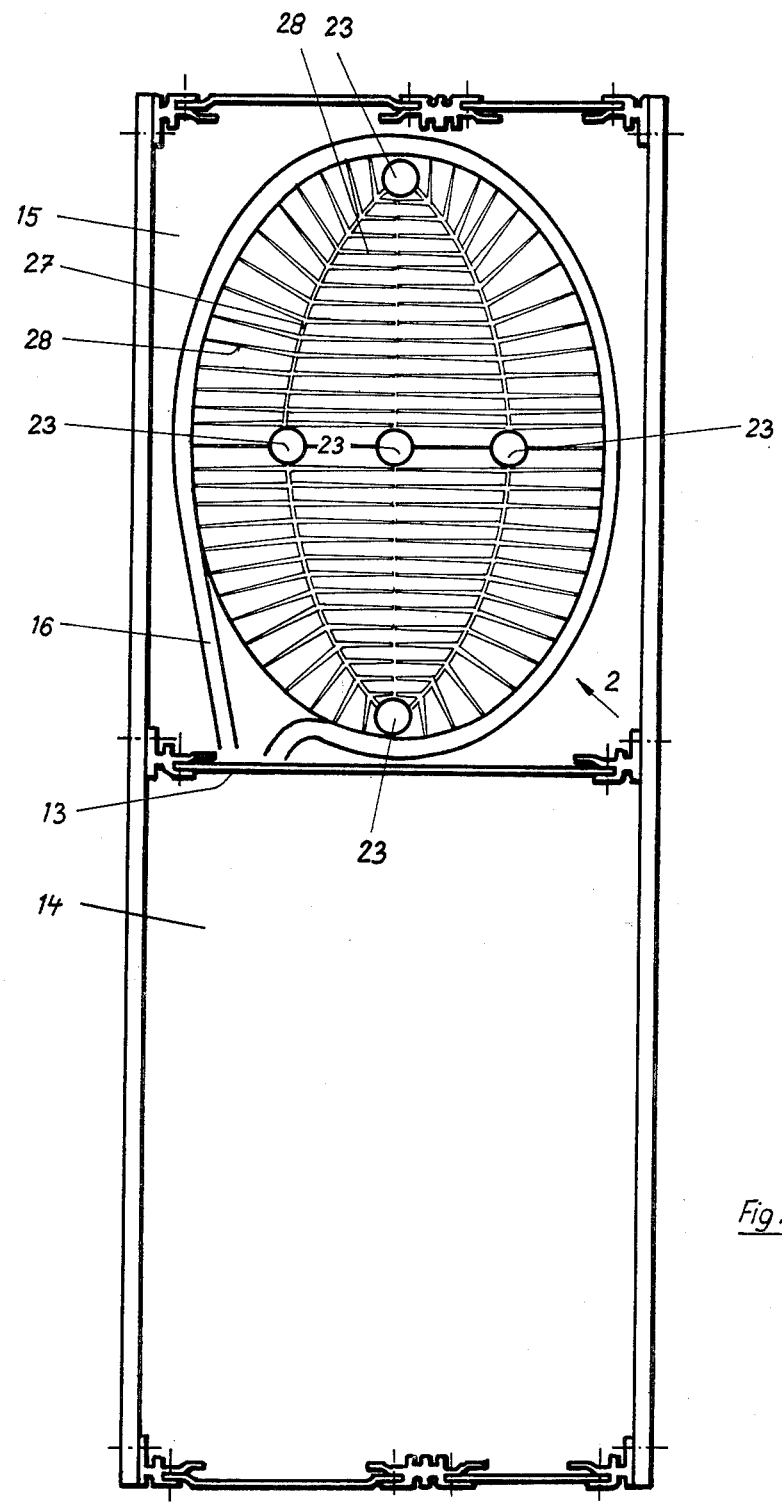
FIG. 4 is a plan view of FIG. 1 in an enlarged scale in comparison thereto, whereby, however, only the condenser is illustrated.
Figure 5:
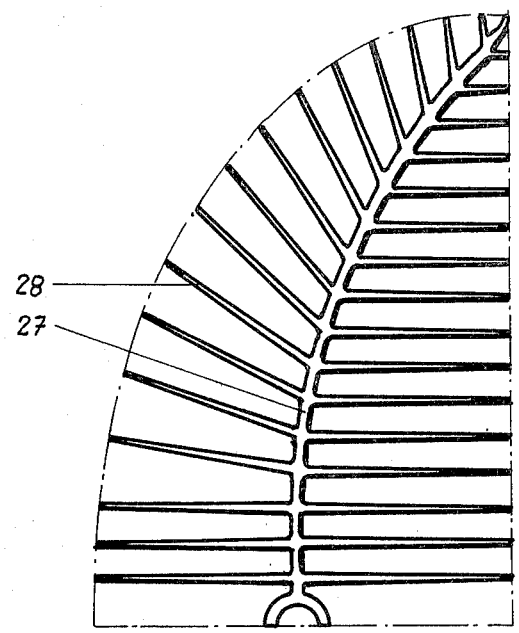
FIG. 5 is a detail illustration of one of the segments exhibiting the cooling surfaces.

FIGS. 3, 4 and 5 show the design of the condenser 3 with its heat exchange surfaces in greater detail. The condensate tubular coil 16 conducting the coolant liquid surrounds profile pieces 27 which are provided with a series of cooling ribs 28, whereby the cooling ribs proceed in the longitudinal direction of the air stream, i.e., in the direction of arrow 29 according to FIG. 3. A plurality of profile pieces 27 can be provided, of which one is separately illustrated in FIG. 5, whereas FIG. 4 shows a composite of four such profile pieces 27 which are both held together as well as clamped toward the outside against the tubular coil 16 by clamping means 23. By so doing, it is not only a mechanical bracing between the profile pieces 27 and the condensate tube 16 surrounding them spirally which is achieved, but, rather, a good heat transfer from the tube 16 to the profile pieces 27 is also achieved. On the other hand, after releasing the clamping means 23, it is unproblematically possible to be able to remove these cooling profiles from the device for a cleaning which may still be necessary and to then reinsert them without the housing needing to be disassembled or without the hermetically sealed coolant circulation needing to be opened. This coolant circulation 24 is indicated in a purely schematic manner in FIG. 1 with dot-dash lines. Let it also be pointed out here that the pressure regulator 4 is situated per se at the compressor output and is only shown at a distance from the compressor output for reasons of simplifying the illustration in FIG. 1. The disposition and the course of the cooling ribs 28 is aerodynamically favorable and is highly insusceptible to contamination from the ambient air. The filters, etc., required in the prior art are not required here. In a manner favorable for production engineering, all four profile pieces 27 are identical to one another and can be cut from an extruded profile.

A connection from that part of the first area 14 which may potentially exhibit condensate to the second area 15 is referenced with 21. Preferably, this connecting line 21 leads to the ventilator 8. By so doing, the condensate collecting on the air deflection means 18 is diverted to the blades of the ventilator 8 and is atomized by them so that it evaporates in the warm, second area 15. Since the outside ventilator 8 is always in operation when the device is switched on and, moreover, it is insensitive to moisture based on its very structure, dissipation or, respectively, disposal of the condensate is always seen to. If necessary, the feeder line 21 can be closed by a clamp 22. This can be the case, for example, when retention of a certain residual moisture is desired in the cabinet 25 in order to avoid static charges disrupting or even destroying the electronic components.

We claim as our invention:

1. Air conditioner for cooling electrical parts, particularly electronic components, situated in a cabinet or the like, comprising a coolant circulation consisting of evaporator, condenser and compressor, whereby the air inside a housing heated by the electrical parts is blown by a ventilator past an evaporator provided with a corresponding heat exchange surface and is blown back into the cabinet or the like to be cooled, and whereby, further, a condenser is provided in order to emit the heat absorbed by the evaporator to the outside air moved by a ventilator, characterized in that the housing of the air conditioner is subdivided into a first area and into a second area by means of a wall sealing the respective air streams from one another; in that all components, including the evaporator, the compressor, and part of the air conditioner sensitive to dirt, dust, etc., are situated in the first area; means for circulating air from said cabinet through said first area to flow over the evaporator and compressor and parts sensitive to dust and for recirculating the cold air back to the cabinet; and in that the condenser with its heat exchange surfaces which are essentially insusceptible to dirt and, further, a ventilator are situated in the second area which is traversed by ambient air as a result of the ventilator.

2. Air conditioner for cooling electrical parts, particularly electronic components, situated in a cabinet or the like, comprising a coolant circulation consisting of evaporator, condenser and compressor, whereby the air inside a housing heated by the electrical parts is blown by a ventilator past an evaporator provided with a corresponding heat exchange surface and is blown back into the cabinet or the like to be cooled, and whereby, further, a condenser is provided in order to emit the heat absorbed by the evaporator to the outside air moved by a ventilator, characterized in that the housing of the air conditioner is subdivided into a first area and into a second area by means of a wall sealing the respective air streams from one another; in that all components, including the compressor, the air conditioner sensitive to dirt, dust, etc., are situated in the first area; and in that the condenser with its heat exchange surfaces which are essentially insusceptible to dirt and, further, a ventilator are situated in the second area which is traversed by ambient air as a result of the ventilator; characterized further in that air deflection means following the evaporator in the direction of air flow are provided in the first area and are disposed in such manner that they conduct a part of the cool air stream over the compressor.

3. Air conditioner according to claim 1, characterized in that the heat exchange surfaces of the condenser consist of cooling ribs which proceed in the longitudinal direction of the ambient air stream.

4. Air conditioner according to claim 1, characterized in that the condenser exhibits a tubular coil with coolant flowing through it, said tubular coil surrounding the heat exchange surfaces with a thermally conductive contact.

5. Air conditioner according to claim 4, characterized in that releasable clamp means are provided which clamp the heat exchange surfaces to the tubular coil of the condenser 3.

6. Air conditioner according to claim 3, characterized in that the cooling ribs are situated at a plurality of, for example, four, mutually connected profile pieces which can be braced relative to one another by means of clamping means.

7. Air conditioner according to claim 3, characterized in that the profile pieces with their ribs are identical to one another and are cut from a correspondingly shaped extruded profile.

8. Air conditioner according to claim 1, characterized in that a preferably electronic control arrangement controlling the speed of the aerator or ventilator in the first area and the on-time of the compressor is provided and is set in such manner that the inside temperature of the cabinet or the like exhibiting the parts to be cooled is not lower than the ambient temperature of the cabinet and air conditioner.

9. Air conditioner according to claim 1, characterized by a connection in order to conduct the condensed water, preferably the condensed water of the first area collecting on the air deflection means, onto the blades of the aerator in the second area.

10. Air conditioner according to claim 9, characterized in that the connection can be closed off by means of a clamp.

* * * * *